United States Patent
Chand et al.

(10) Patent No.: US 10,720,946 B2
(45) Date of Patent: *Jul. 21, 2020

(54) DC COUPLED RADIO FREQUENCY MODULATOR

(71) Applicant: TEXAS INSTRUMENTS INCORPORATED, Dallas, TX (US)

(72) Inventors: Jagdish Chand, Bengaluru (IN); Subhashish Mukherjee, Bengaluru (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 16/361,806

(22) Filed: Mar. 22, 2019

(65) Prior Publication Data

US 2019/0379412 A1  Dec. 12, 2019

Related U.S. Application Data

(63) Continuation of application No. 16/004,503, filed on Jun. 11, 2018, now Pat. No. 10,284,238.

(51) Int. Cl.
  *H04B 1/04* (2006.01)
  *H03F 3/24* (2006.01)
  *H03F 3/19* (2006.01)
  *H04B 1/00* (2006.01)

(52) U.S. Cl.
  CPC .......... *H04B 1/0475* (2013.01); *H03F 3/19* (2013.01); *H03F 3/245* (2013.01); *H04B 1/0028* (2013.01); *H03F 2200/451* (2013.01); *H04B 2001/0408* (2013.01); *H04B 2001/0416* (2013.01)

(58) Field of Classification Search
  CPC ...... H03F 2200/451; H03F 3/19; H03F 3/245; H04B 1/0475; H04B 2001/0416; H05B 2213/07; H05B 6/062
  USPC ........... 455/69, 522, 127.2, 13.4, 115.1, 138, 455/245.1, 341, 295; 332/103
  See application file for complete search history.

(56) References Cited

U.S. PATENT DOCUMENTS

| | | | | |
|---|---|---|---|---|
| 4,837,786 A | * | 6/1989 | Gurantz | H04B 1/707 370/206 |
| 4,843,392 A | * | 6/1989 | Gulczynski | H03M 1/0675 341/118 |
| 5,442,379 A | * | 8/1995 | Bruce | G09G 5/06 345/589 |
| 5,847,619 A | * | 12/1998 | Kirisawa | H04L 27/20 332/103 |
| 6,073,050 A | * | 6/2000 | Griffith | A61N 1/37223 340/870.24 |
| 6,577,691 B2 | | 6/2003 | Richards et al. | |

(Continued)

FOREIGN PATENT DOCUMENTS

EP   1396932   3/2004

*Primary Examiner* — Tan H Trinh
(74) *Attorney, Agent, or Firm* — Ray A. King; Charles A. Brill; Frank D. Cimino

(57) ABSTRACT

A radio frequency transmitter includes a digital-to-analog converter (DAC), a load circuit, and a modulator circuit. The load circuit is coupled to an output of the DAC. The modulator circuit is coupled to the DAC and the load circuit. The modulator circuit includes a driver circuit configured to provide a bias voltage to the load circuit, and an amplifier configured to receive an output of the DAC biased by an output of the load circuit.

5 Claims, 1 Drawing Sheet

(56) References Cited

U.S. PATENT DOCUMENTS

| | | | |
|---|---|---|---|
| 6,636,112 B1 | 10/2003 | McCune | |
| 7,227,878 B1 | 6/2007 | Choi et al. | |
| 8,599,055 B1 | 12/2013 | Karthaus | |
| 9,048,860 B1* | 6/2015 | Quinn | H03M 1/46 |
| 9,531,337 B2* | 12/2016 | Chen | H03F 3/45479 |
| 9,647,639 B1* | 5/2017 | Chamas | H03F 3/19 |
| 9,893,728 B2* | 2/2018 | Song | H03K 19/018514 |
| 9,979,411 B1 | 5/2018 | Gupta et al. | |
| 10,090,808 B1* | 10/2018 | Henzler | H03F 1/0216 |
| 10,284,238 B1* | 5/2019 | Chand | H04B 1/0475 |
| 2006/0291589 A1* | 12/2006 | Eliezer | H03C 3/40 |
| | | | 375/302 |
| 2007/0026835 A1 | 2/2007 | Yamaji et al. | |
| 2008/0164928 A1* | 7/2008 | Rausch | H03H 11/20 |
| | | | 327/258 |
| 2011/0074615 A1* | 3/2011 | Seo | H03M 1/742 |
| | | | 341/144 |
| 2011/0115503 A1* | 5/2011 | Chou | H03K 17/962 |
| | | | 324/679 |
| 2011/0116558 A1* | 5/2011 | Otaka | H03F 1/34 |
| | | | 375/259 |
| 2012/0206201 A1* | 8/2012 | Mizokami | H03F 1/0266 |
| | | | 330/254 |
| 2012/0269240 A1* | 10/2012 | Balteanu | H03F 1/0227 |
| | | | 375/219 |
| 2015/0035545 A1* | 2/2015 | Langer | H04W 52/226 |
| | | | 324/629 |
| 2015/0349722 A1* | 12/2015 | Wang | H03F 1/26 |
| | | | 330/295 |
| 2016/0036389 A1* | 2/2016 | Balteanu | H02M 3/155 |
| | | | 330/252 |
| 2017/0019082 A1* | 1/2017 | Ishihara | H03G 3/3042 |
| 2017/0294885 A1* | 10/2017 | Kang | H03F 1/3241 |

* cited by examiner

DC COUPLED RADIO FREQUENCY MODULATOR

CROSS REFERENCE TO RELATED APPLICATION(S)

This continuation application claims priority to U.S. patent application Ser. No. 16/004,503, filed Jun. 11, 2018, which application is incorporated herein by reference in its entirety.

BACKGROUND

In radio frequency (RF) transmitters (e.g., wired or wireless RF transmitters), up-converters transform a baseband signal into an RF signal. Up conversion may be performed in the analog domain or in the digital domain. Analog up-converters include analog mixer circuitry that combines a baseband signal with a higher frequency local oscillator signal to produce a sum and/or difference of the baseband signal and the local oscillator signal.

SUMMARY

A modulator circuit that controls the common-mode voltage applied at its input without an intermediate frequency amplifier, and a radio frequency (RF) transmitter that applies the modulator are disclosed herein. In one example, an RF transmitter includes a digital-to-analog converter (DAC), a load circuit, and a modulator circuit. The load circuit is coupled to an output of the DAC. The modulator circuit is coupled to the DAC and the load circuit. The modulator circuit includes a driver circuit configured to provide a bias voltage to the load circuit, and an amplifier configured to receive an output of the DAC biased by an output of the load circuit.

In another example, an RF modulator circuit includes an amplifier and a common-mode control circuit. The amplifier is configured to receive a signal to be modulated. The signal includes a common mode voltage. The common-mode control circuit is configured to generate a bias voltage for driving a load circuit that produces the common mode voltage, and to generate the bias voltage as a sum of the common-mode voltage and a voltage dropped across the load circuit.

In a further example, a circuit includes a common-mode control circuit. The common-mode control circuit includes a signal input terminal, a common mode voltage generation circuit, a load voltage input terminal, a summation circuit, a bias voltage output terminal, and a driver circuit. The summation circuit includes a first input that is coupled to the load voltage input terminal, and a second input that is coupled to an output of the common mode voltage generation circuit. The driver circuit includes an output that is coupled to the bias voltage output terminal, and an input that is coupled to an output of the summation circuit.

BRIEF DESCRIPTION OF THE DRAWINGS

For a detailed description of various examples, reference will now be made to the accompanying drawings in which.

DETAILED DESCRIPTION

Figure 1:
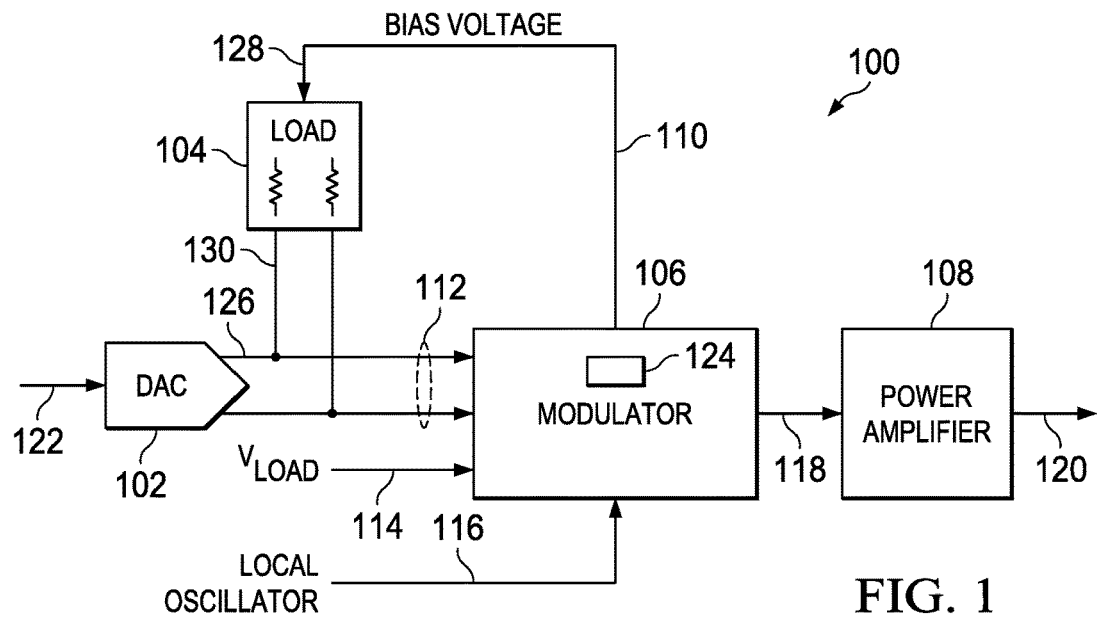
FIG. 1 shows a block diagram for an example of a radio frequency transmitter in accordance with the present disclosure.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Some radio frequency (RF) systems directly couple (e.g., direct current (DC) couple) the output of a digital-to-analog converter (DAC) that generates the signal to be transmitted to the input of a modulator (e.g., an in-band/quadrature (I/Q) modulator). Most DACs produce relatively high common-mode voltages (e.g., about 2 volts), or relatively low common-mode voltages (about 0 volts) depending on whether the DAC uses negative metal oxide semiconductor (NMOS) (or negative-positive-negative (NPN) bipolar) current sources, or positive metal oxide semiconductor (PMOS) (or positive-negative-positive (PNP) bipolar) current sources. Similarly, modulators operate with a common-mode voltage that is a function of the applied transistor types. However, most modulators are very sensitive, compared to DACs, to input common-mode voltages because the input stage bias current of the modulator is directly determined by the input common-mode voltage. Even a few tens of millivolts of change in input common-mode voltage can degrade modulator performance.

Some RF systems reduce the effects of input common-mode voltage on the modulator by providing an intermediate frequency (IF) amplifier in the signal path between the DAC output and the modulator input. The IF amplifier translate the common-mode voltage at the output of the DAC to the common-mode voltage needed at the input of the modulator. However, use of an IF amplifier is problematic for a number of reasons. Two IF amplifiers are needed for use with and I/Q modulator. Each of the amplifiers consumes circuit area, and power (e.g., 0.5-0.75 watts per IF amplifier), and can degrade system noise and linearity.

The RF systems disclosed herein control the common-mode voltage provided at the input of the modulator without use of an IF amplifier. Implementations of the modulator disclosed herein generate a bias voltage for controlling the common-mode input voltage. The bias voltage is provided to a load circuit connected to the output of the DAC. The bias voltage is a sum of the common-mode voltage desired at the signal input of the modulator and the voltage dropped across the load circuit. Driving the load circuit with the bias voltage produces the desired common-mode voltage at the output of the DAC and the input of the modulator. The modulator adjusts the bias voltage with temperature, process variation, and other factors affecting the desired common-mode voltage to ensure that the optimum common-mode voltage is provided at the input of the modulator.

FIG. 1 shows a block diagram for an example of an RF transmitter 100 in accordance with the present disclosure. The RF transmitter 100 includes a DAC 102, a load circuit 104, a modulator circuit 106, and a power amplifier 108. DAC 102 converts digital samples 122 of a signal to be transmitted to an analog signal suitable for modulation. Some implementations of the DAC 102 output a differential signal 112. The output 126 of the DAC 102 is coupled to the load circuit 104. The load circuit 104 includes resistors (e.g., pull-up and/or pull-down resistors) that apply an offset voltage to the output signal generated by the DAC 102. The offset voltage produced by the load circuit 104 is applied to the differential signal 112 produced by the DAC 102 as a common-mode voltage. For example, in some implementations the load circuit 104 applies a 1.2 volts (or any other voltage) of offset to both positive and negative portions of the differential signal 112 produced by the DAC 102.

The differential signal 112 generated by the DAC 102, as biased by the load circuit 104, is provided to the modulator circuit 106. The modulator circuit 106 receives the differential signal 112 and a local oscillator signal 116. The modulator circuit 106 multiplies the differential signal 112 and the local oscillator signal 116 to shift the differential signal 112 to a higher frequency RF signal 118 suitable for transmission. The RF signal 118 is provided to the power amplifier 108. The power amplifier 108 amplifies the RF signal 108 to drive an antenna, a cable, or other transmission medium.

If the common-mode voltage provided on the differential signal 112 does not match the common-mode voltage required by input circuitry of the modulator circuit 106, the performance of the modulator circuit 106 may be negatively affected. To ensure that the common-mode voltage received on the differential signal 112 matches the common-mode voltage required by the input circuitry of the modulator circuit 106, the modulator 106 includes common-mode control circuitry 124. The common-mode control circuitry 124 generates a bias voltage 110 that is applied to the load circuit 104. The common-mode control circuitry 124 generates the bias voltage 110 as a sum of the voltage drop 114 across the load circuit 104 and a voltage generated in the modulator circuit 106 that is equal to the common-mode voltage desired on the differential signal 112. The voltage drop 114 across the load circuit 104 is provided to the modulator circuit 106 by circuitry (e.g., reference circuits and/or voltage generation circuits) external to the modulator 106. The portion of the bias voltage 110 corresponding to the voltage drop 114 is dropped across the load circuit 104, and the desired common-mode voltage is applied to the differential signal 112.

By controlling the bias voltage 110 provided to the load circuitry 104, the modulator 106 ensures that the common-mode voltage applied to the differential signal 112 matches the common-mode voltage needed for optimal performance of the modulator circuit 106. Implementations of the RF transmitter 100, require no IF amplifier between the DAC 102 and the modulator 106, and therefore reduce circuit area and power consumption relative transmitters that include an IF amplifier to control common-mode voltage at the input of the modulator.

Figure 2:
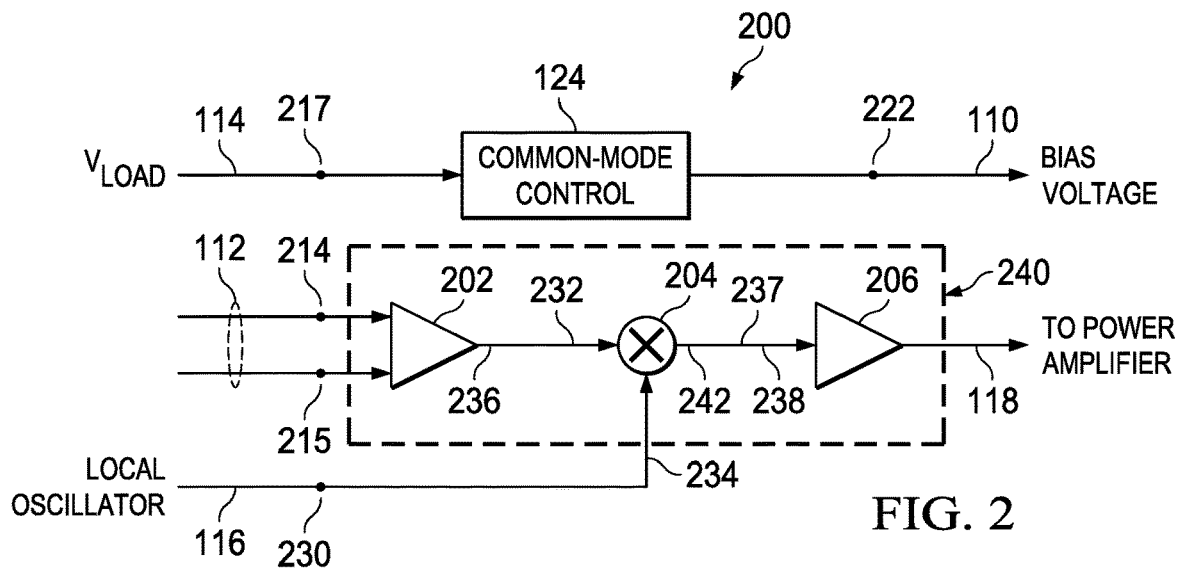
FIG. 2 shows a block diagram for an example of a modulator circuit that controls common-mode input voltage in accordance with the present disclosure.

FIG. 2 shows a block diagram for an example of a modulator circuit 200 that controls common-mode input voltage in accordance with the present disclosure. The modulator circuit 200 is an implementation of the modulator circuit 106. The modulator circuit 200 includes signal input terminals 214 and 215, a load voltage input terminal 217, a local oscillator input terminal 230, a bias voltage output terminal 222, modulation circuitry 240 and common-mode control circuitry 124. The modulation circuitry 240 includes an input amplifier 202, a mixer circuit 204, and an RF amplifier 206. The input amplifier 202 is coupled to the signal input terminals 214 and 215 to receive the differential signal 112 generated by the DAC 102. The input amplifier 202 amplifies the differential signal 112 and provides the amplified signal to the mixer circuit 204. In implementations of the RF transmitter 100, the input terminal 214 is coupled to an output 126 of the DAC 102 and to an output terminal 130 of the load circuit 104.

The mixer circuit 204 includes an input 234 that is coupled to the local oscillator input terminal 230 to receive an oscillator signal generated external to the modulator circuit 200. The mixer circuit 204 includes an input 232 that is coupled to an output 236 of the input amplifier 202 to receive the amplified differential signal produced by the input amplifier 202. The mixer circuit 204 combines (e.g., multiplies) the local oscillator signal and the output signal of the input amplifier 202 to produce an RF output signal 237. The mixer circuit 204 provides the RF output signal 237 to the RF amplifier 206 via a connection of an output 242 of the mixer circuit 204 to an input 238 of the RF amplifier 206.

The RF amplifier 206 receives the RF output signal produced by the mixer circuit 204, applies gain to the received signal, and produces an RF signal 118 that is suitable for transmission. The RF amplifier 206 provides the RF signal 118 to the power amplifier 108.

Figure 3:
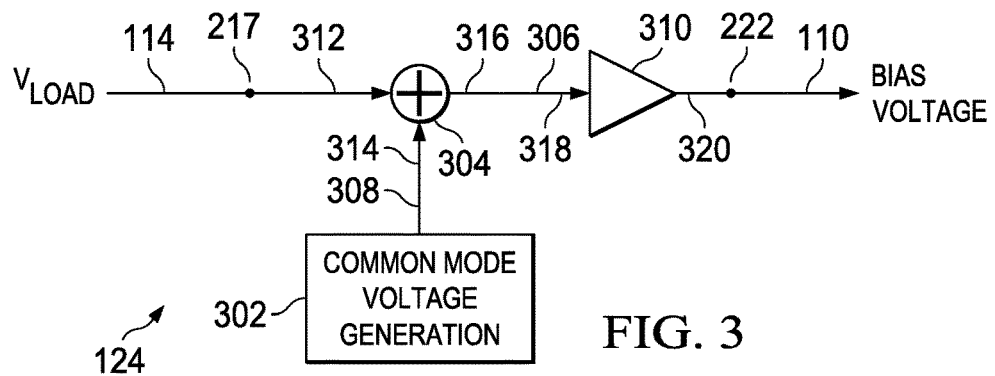
FIG. 3 shows a block diagram for an example of common-mode control circuitry in accordance with the present disclosure.

The common-mode control circuitry 124 controls the common-mode voltage present on the differential signal 112 to improve the performance of the input amplifier 202 and the modulator 200 in general. FIG. 3 shows a block diagram for an example of the common-mode control circuitry 124 in accordance with the present disclosure. The common-mode control circuitry 124 includes a common mode voltage generation circuit 302, a summation circuit 304, and a driver circuit 310. The common mode voltage generation circuit 302 includes circuitry to produce an internal voltage that is equal to the common-mode voltage desired on the differential signal 112. In some implementations, the common mode voltage generation circuit 302 replicates a portion of the input circuitry of the input amplifier 202 to ensure that the common mode voltage generation circuit 302 produces the common-mode voltage needed by the input circuitry over temperature and process variations.

The summation circuit 304 includes circuitry to sum the voltage generated by the common mode voltage generation circuit 302 and the voltage drop 114 across the load circuit 104 received at the load voltage input terminal 217. For example, an implementation of the summation circuit 304 includes an amplifier configured to sum the voltage at the load voltage input terminal 217 and the output of the common mode voltage generation circuit 302. The summation circuit 304 includes an input 312 to receive the voltage at the load voltage input terminal 217, an input 314 to receive the output 308 of the common mode voltage generation circuit 302, and an output 316. The summation circuit 304 provides, to the driver circuit 310, via the output 316, an output voltage 306 equal to the sum of the voltage at the load voltage input terminal 217 and the output 308 of the common mode voltage generation circuit 302.

The driver circuit 310 is, for example, a unity gain amplifier that includes a low impedance output stage for driving the output voltage 306 received from the summation circuit 304 onto the load circuit 104. The driver circuit 310 includes an input 318 that is coupled to the summation circuit 304, and an output 320 that is coupled to the bias voltage output terminal 222. The output voltage produced by the driver circuit 310 is the bias voltage 110. In the RF system 100, the bias voltage output terminal 222 is coupled to a terminal 128 of the load circuit 104 to provide the bias voltage 110 to the load circuit 104.

While the common-mode control circuit 124 has been described herein with reference to the modulator 200 and the RF transmitter 100, implementations of the common-mode control circuit 124 are applicable to any circuit that requires a precise and controllable common-mode input voltage.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A radio frequency (RF) transmitter, comprising:
    a digital-to-analog converter (DAC);
    a load circuit directly coupled to an output of the DAC;
    a modulator circuit coupled to the DAC and the load circuit, the modulator circuit comprising:
        a driver circuit configured to provide a bias voltage to the load circuit; and
        an amplifier configured to receive an output signal generated by the DAC biased by the load circuit.

2. The RF transmitter of claim 1, wherein the modulator circuit comprises common mode voltage generation circuitry configured to generate a common mode voltage to be provided at an input of the amplifier.

3. The RF transmitter of claim 1, wherein the modulator circuit includes an output terminal configured to provide the bias voltage to the load circuit.

4. The RF transmitter of claim 1, wherein the modulator circuit comprises an input configured to receive a voltage equal to a voltage dropped across the load circuit.

5. The RF transmitter of claim 1, wherein the modulator circuit comprises:
    a mixer circuit coupled to the amplifier, the mixer circuit configured to combine an output signal provided by the amplifier with a local oscillator signal; and
    an RF amplifier configured to drive a power amplifier.

* * * * *